United States Patent [19]

Masuda et al.

[11] Patent Number: 4,982,728
[45] Date of Patent: Jan. 8, 1991

[54] APPARATUS FOR ASSEMBLING SEMICONDUCTOR DEVICES

[75] Inventors: Hisao Masuda; Hitoshi Fujimoto; Shuichi Osaka, all of Itami, Japan

[73] Assignee: Mitsubishi Denki Kabushiki Kaisha, Japan

[21] Appl. No.: 461,070

[22] Filed: Jan. 4, 1990

[30] Foreign Application Priority Data

Jul. 7, 1989 [JP] Japan .................................. 1-174174

[51] Int. Cl.$^5$ ....................... H01L 21/58; H01L 21/60
[52] U.S. Cl. ..................................... 228/4.5; 228/103; 73/863.91; 73/865.6; 198/339.1; 198/346.2
[58] Field of Search ................. 228/4.5, 103, 105, 179, 228/904; 29/740, 741, 729, 759; 73/863.91, 863.92, 865.8, 865.9; 198/339.1, 346.2

[56] References Cited

U.S. PATENT DOCUMENTS

| 3,310,216 | 3/1967 | Köllner et al. | 228/4.5 |
| 3,878,726 | 4/1975 | Hamatani | 73/863.91 |
| 4,301,958 | 11/1981 | Hatakenaka et al. | 228/4.5 |
| 4,607,536 | 8/1986 | Lawson et al. | 73/863.91 |
| 4,696,104 | 9/1987 | Vanzetti et al. | 228/103 |
| 4,801,234 | 1/1989 | Cedrone | 198/346.2 |

FOREIGN PATENT DOCUMENTS 4035 1/1984 Japan .................................. 228/4.5

OTHER PUBLICATIONS

Hitachi Tokyo Electronics Company, "Automatic Through Line Assembling System", p. 12.
Hitachi Tokyo Electronics Company, "Flexible Through Line Assembling System", p. 13.

Primary Examiner—Sam Heinrich
Attorney, Agent, or Firm—Leydig, Voit & Mayer

[57] ABSTRACT

An apparatus for assembling semiconductor devices includes a transportation line for transporting partially fabricated articles such as lead frames with a semiconductor chip mounted thereon; a working unit disposed in the transportation line for processing the partially fabricated articles by wire bonding or die bonding; an inspection unit disposed separately from the transportation line; a delivery unit for extracting a processed article from the transportation line, moving the extracted worked article to an inspection section and returning the processed article to the transportation line after checking; and a stock unit for stocking the processed articles. In the inspection section, one of the processed articles selected for sampling inspection is placed on a support and is checked with a microscope. During checking, the support and the microscope can be moved relative to each other to enable observation of the whole of the selected article.

8 Claims, 4 Drawing Sheets

APPARATUS FOR ASSEMBLING SEMICONDUCTOR DEVICES

BACKGROUND OF THE INVENTION

Field of the Invention

This invention relates to an apparatus for assembling semiconductor devices.

Description of the Related Art

FIG. 4 is a block diagram of an example of a conventional assembly apparatus. A stock unit 3 is connected by a transportation unit 2 to a wire bonding unit 1. A lead frame on which a semiconductor chip is mounted is introduced into the wire bonding unit 1 where electrodes of the semiconductor chip and leads of the lead frame are connected to each other by wire bonding. After wire bonding, the lead frame is transported to the stock unit 3 and is stocked therein.

For manufacture of a high-quality semiconductor device, it is necessary to check whether or not the lead frame has been normally wire bonded. Conventionally, for checking, the operator extracts wire bonded i.e., processed, from the transportation unit 2 or the stock unit 3, and carries them to an inspection support separate from the assembly apparatus of FIG. 4. After checking, non-defective lead frames are returned to the stock unit 3.

This process of manually carrying and checking articles entails a risk of the processed articles being contaminated or broken.

In view of this problem, the applicant of the present invention proposed, in Japanese Published Patent Application No. 61-55930, an in-process lead frame transportation unit which is provided in a semiconductor device production line and which includes a lead frame inspection mechanism. FIG. 5 shows a flow diagram of this apparatus. After wire bonding on a lead frame 4 performed by a wire bonding unit 1, the lead frame 4 is transported to an inspection mechanism 7 by an automatic lead frame transportation mechanism 6 to be checked. If the lead frame 4 is determined to be non-defective as a result of checking, it is transported along the line indicated by the arrow A, is temporarily stocked by a non-defective stock mechanism 8, and is thereafter transported to a molding unit 10 or the like for the next step. If the lead frame 4 is defective, it is transported from the inspection mechanism 7 to a defective stock mechanism 9 along the line indicated by the arrow B.

The provision of the inspection mechanism 7 in the production line eliminates the need for the operator to carry worked articles for checking, thereby reducing the risk of contamination or breakage of the processed articles during the inspection process.

However, processed articles are checked ordinarily in a stationary state by means of a microscope or the like, and it is, therefore necessary to stop the flow of the production line for a period of time required to check the articles. If the time required to check one processed article is longer than the time required to process one article in the preceding step or to further process the article in the subsequent step, the overall flow speed of the manufacture line is reduced to enable checking, resulting in a reduction in productivity.

SUMMARY OF THE INVENTION

In view of these problems, an object of the present invention is to provide an apparatus for assembling semiconductor devices which enables checking of processed articles without any risk of contamination or breakage of the articles and which enables an improvement in productivity.

To this end, the present invention provides an assembly apparatus for assembling semiconductor devices having a transportation line for transporting partially fabricated articles from which semiconductor devices are formed; a working means disposed in the transportation line and used to process the partially fabricated articles; a checking means disposed separately from the transportation line and used to check the articles processed; and a delivery means for extracting one of the processed articles from the transportation line, moving the extracted article to the checking means and returning the article to the transportation line after checking.

DESCRIPTION OF THE PREFERRED EMBODIMENT

An embodiment of the present invention will be described below with reference to the accompanying drawings.

Figure 1:
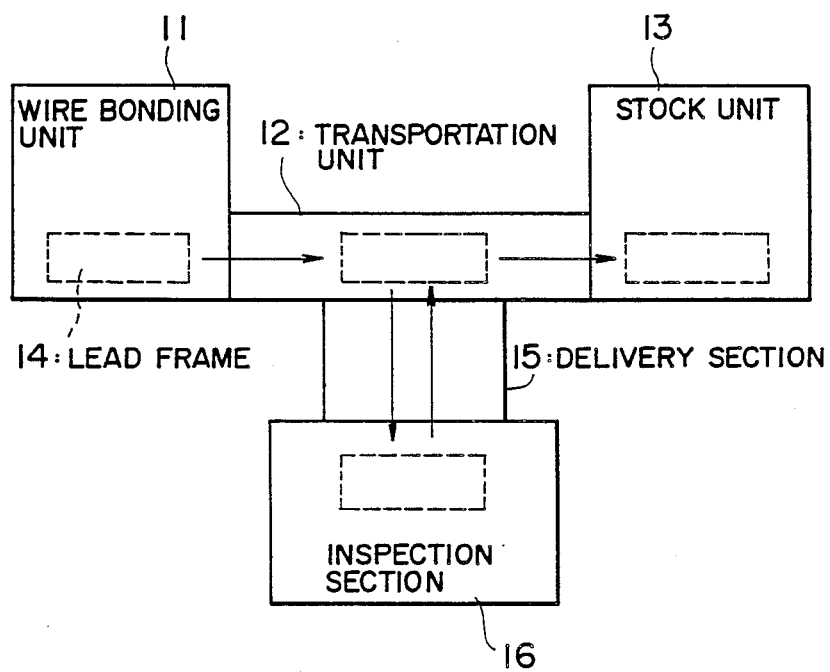
FIG. 1 is a block diagram of an apparatus for assembling semiconductor devices which represents an embodiment of the present invention.
Figure 2:
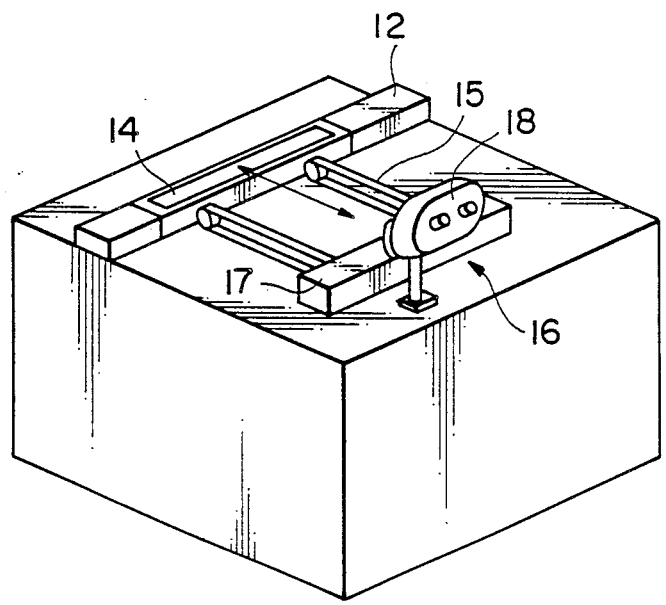
FIGS. 2 and 3 are schematic perspective views of portions of the embodiment shown in FIG. 1.

Referring to FIG. 1, a stock unit 13 is connected by a transportation unit 12 to a wire bonding unit 11 which serves as a working means. The transportation unit 12 which transports lead frames 14 which are partially fabricated semiconductor devices forms a transportation line. The stock unit 13 stocks worked lead frames 14 successively transported by the transportation unit 12. An inspection unit 16 which is disposed at the side of the transportation unit 12 is connected to the transportation unit 12 by a delivery unit 15. The delivery unit 15 extracts one of the lead frames 14 transported by the transportation unit 12 and translates the extracted lead frame 14 between the transportation unit 12 and the inspection unit 16. As shown in FIG. 2, the inspection unit 16 is provided with an inspection support 17 on which one of the lead frames 14 to be checked is placed, and a microscope 18 for observing worked portions of the lead frame 14, i.e., wire-bonded portions and so on. The microscope 18 is disposed in the vicinity of the inspection support 17.

Next, the operation of this embodiment will be described below.

First, as shown in FIG. 1, a lead frame 14 on which a semiconductor chip (not shown) is placed is introduced into the wire bonding unit 11 where electrodes of the semiconductor chip and the leads of the lead frame 14 are connected to each other by wire bonding. After wire bonding, the lead frame 14 is transported by the transportation unit 12 from the wire bonding unit 11 to the stock unit 13 and is stocked in the stock unit 13.

A multiplicity of, lead frames 14 are successively wire bonded in this way and wire-bonded lead frames 14 are stocked in the stock unit 13. Each time a predetermined number of lead frames 14 is completed, sampling inspection of the lead frames 14 is conducted in order to check whether or not the wire bonding is normal. In this case, one of the worked lead frames 14 is extracted by the delivery unit 15 from the transportation unit 12 in the course of transportation from the wire bonding unit 11 to the stock unit 13 and is moved onto the inspection support 17 of the inspection unit 16 shown in FIG. 2. In this state, the worked portions of the lead frame 14 are checked by using the microscope 18.

Even during checking of the lead frame 14, the wire bonding operation of the wire bonding unit 11 is continued and succeeding worked lead frames 14 are stocked in the stock unit 13.

When the checking in the inspection unit 16 is completed, the checked lead frame 14 is returned to the transportation unit 12 by the delivery unit 15 and is transported to the stock unit 13 by the transportation unit 12.

It is thus possible to check one of worked lead frames 14 for sampling inspection without interrupting the transportation of other lead frames 14 to the stock unit 13. That is, even if the time taken to perform checking is excessively long, the flows of lead frames 14 is not stopped, thus preventing any reduction in productivity.

Figure 3:
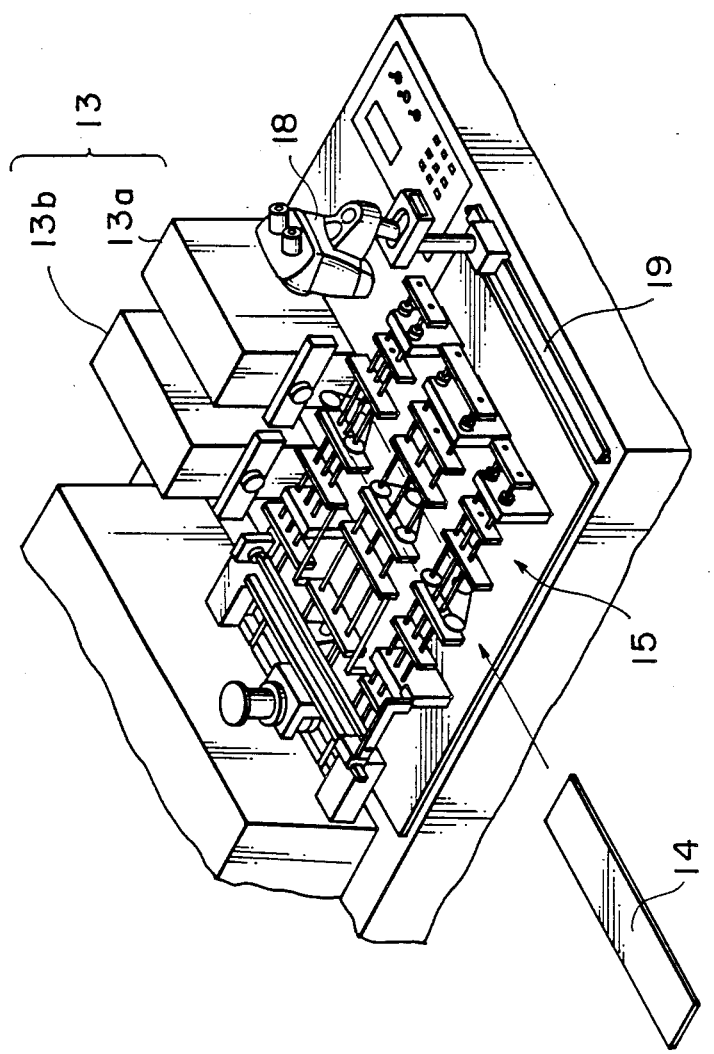
Figure 4:
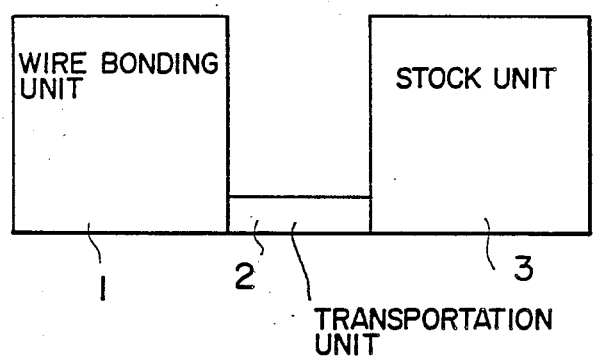
FIG. 4 is a block diagram of a conventional apparatus for assembling semiconductor devices.
Figure 5:
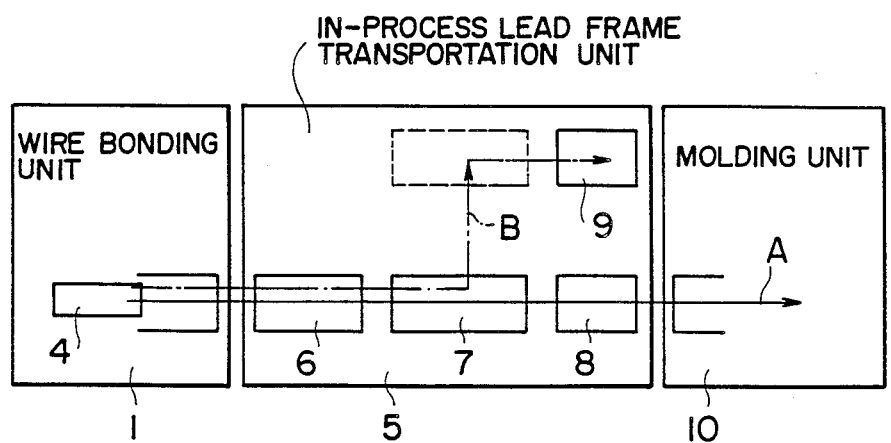
FIG. 5 is a flow diagram of another conventional apparatus.

As shown in FIG. 3, the stock unit 13 may be separated into a stock section 13a for stocking non-defective articles and a stock section 13b for stocking defective articles, lead frames 14 determined to be defective being stocked in the defective stock section 13b. If the microscope 18 used for checking is movably supported on a rail 19 and is moved during checking in the longitudinal direction of the lead frame 14 supplied to be checked, the lead frame 14 can be easily checked over its whole area. Conversely, the microscope 18 may be fixed while the inspection support on which the lead frame 14 is supported is moved in the longitudinal direction of the lead frame 14, thereby also ensuring that the lead frame 14 can be easily checked over its whole area.

Furthermore, a molding unit may be disposed in place of or downstream of the stock unit 13 to mold each lead frame 14 after wire bonding. The above-described embodiment is applied to a working process using the wire bonding unit 11, but the present invention is not limited to this process. For example, the results of die bonding performed by a die bonding unit may be checked in the inspection unit. In accordance with the present invention, a further arrangement is possible in which steps from die bonding to molding are performed continuously.

What is claimed is:

1. An apparatus for assembling semiconductor devices comprising:
    working means for processing partially fabricated articles from which semiconductor devices are being made;
    a transportation line for transporting the partially fabricated articles from said working means;
    checking means disposed outside said transportation line for checking articles processed by said working means for defects; and
    delivery means for selectively extracting from and returning to said transportation line a sample comprising less than one hundred percent of the articles processed by said working means, said delivery means moving the articles extracted from said transportation line to said checking means and returning the extracted articles to said transportation line from said checking means after checking for defects.

2. An apparatus according to claim 1, wherein said working means is a wire bonding unit, each of the worked articles being a lead frame on which a semiconductor chip is mounted and which is connected to the semiconductor chip by wire bonding effected by said wire bonding unit.

3. An apparatus according to claim 1, wherein said working means is a die bonding unit, each of the processed articles being a lead frame on which a semiconductor chip is mounted by said die bonding unit.

4. An apparatus according to claim 1, comprising stock means disposed in said transportation line for receiving and stocking the processed articles.

5. An apparatus according to claim 4, wherein said delivery means is disposed between said working means and said stock means.

6. An apparatus according to claim 1, wherein said checking means includes an inspection support for supporting at least one processed article, and a microscope for observing the processed article supported on said inspection support.

7. An apparatus according to claim 6, wherein said microscope is movable in a longitudinal direction of a processed article supported on said inspection support in order to observe all of the processed article.

8. An assembly apparatus according to claim 6, wherein said inspection support is movable in a longitudinal direction of a processed article supported on said inspection support in order to observe all of the processed article.

* * * * *